US011115041B1

(12) United States Patent
Witte et al.

(10) Patent No.: US 11,115,041 B1
(45) Date of Patent: Sep. 7, 2021

(54) FILTER APPARATUS AND CONTROL METHOD

(71) Applicant: Infineon Technologies AG, Neubiberg (DE)

(72) Inventors: Jan Witte, Schonstett (DE); Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/837,068

(22) Filed: Apr. 1, 2020

(51) Int. Cl.
  *H03M 1/10* (2006.01)
  *H03M 1/46* (2006.01)
  *H03M 3/00* (2006.01)
  *H03M 3/02* (2006.01)

(52) U.S. Cl.
  CPC ............. *H03M 1/462* (2013.01); *H03M 3/02* (2013.01); *H03M 3/344* (2013.01); *H03M 3/378* (2013.01); *H03M 3/498* (2013.01)

(58) Field of Classification Search
  CPC ........ H03M 3/458; H03M 3/378; H03M 1/12; H03M 3/386; H03M 3/43; H03M 1/1009; H03M 3/344; H03M 3/45; H03M 1/10; H03M 1/121; H03M 1/00
  USPC ................................................ 341/118–121
  See application file for complete search history.

(56) References Cited

U.S. PATENT DOCUMENTS

| | | | | |
|---|---|---|---|---|
| 3,573,800 A | * | 4/1971 | Gardner | H03M 1/42 341/165 |
| 5,644,309 A | * | 7/1997 | Bartlett | H03M 1/109 341/120 |
| 5,909,186 A | * | 6/1999 | Gohringer | H03M 1/1071 341/120 |
| 6,333,706 B1 | * | 12/2001 | Cummings | H03M 1/108 341/120 |
| 6,404,375 B1 | * | 6/2002 | Munoz | H03M 1/1042 341/118 |
| 9,748,970 B1 | * | 8/2017 | Fang | H03M 1/66 |
| 9,780,803 B1 | * | 10/2017 | Bal | H03M 1/1071 |
| 2006/0085154 A1 | * | 4/2006 | Dahle | H03M 1/1071 702/108 |
| 2009/0206864 A1 | * | 8/2009 | Gurevitch | H03M 1/109 324/750.3 |
| 2016/0111954 A1 | * | 4/2016 | Bach | H04R 19/04 381/113 |
| 2016/0211861 A1 | * | 7/2016 | Op't Eynde | H03M 1/109 |
| 2019/0386675 A1 | * | 12/2019 | Kim | H03H 17/0671 |
| 2019/0393884 A1 | * | 12/2019 | Ferre Fabregas | H03M 1/1071 |

* cited by examiner

*Primary Examiner* — Linh V Nguyen
(74) *Attorney, Agent, or Firm* — Slater Matsil, LLP (57) ABSTRACT

A system includes an analog-to-digital converter configured to convert an analog signal generated by a digital sensor into a digital signal, and a testing apparatus configured to be enabled after the analog-to-digital converter operates in a testing mode, wherein the testing apparatus comprises a filter configured to receive the digital signal from the analog-to-digital converter, and apply a filtering process to the digital signal, a control circuit configured to terminate the filtering process after an output of the control circuit reaches a predetermined reference value, and a result register configured to receive a result generated by the filter after the control circuit terminates the filtering process.

19 Claims, 6 Drawing Sheets

FILTER APPARATUS AND CONTROL METHOD

TECHNICAL FIELD

The present invention relates generally to an apparatus for testing digital microelectromechanical system (MEMS) sensors (e.g., digital MEMS microphones) including an analog-to-digital converter.

BACKGROUND

A digital sensor (e.g., a digital MEMS microphone) is an acoustic sensor converting an acoustic pressure signal to an analog signal. The digital MEMS microphone includes an MEMS sensor and an application specific integrated circuit (ASIC). The MEMS sensor and the ASIC are disposed in a single package. The MEMS sensor and the ASIC are connected together through suitable electrical connections.

The MEMS sensor functions as a variable capacitor having a first plate and a second plate. One of the two plates is a movable plate. The movable plate is also known as a membrane. When an acoustic pressure signal is applied to the MEMS sensor, the membrane is able to move in response to the acoustic pressure signal. The deflection of the membrane relative to the other plate results in a change of capacitance of the membrane. The variation of the capacitance is determined by various parameters of the acoustic pressure signal such as sound pressure levels. The variation of the capacitance of the MEMS sensor results, in turn, into a voltage change, which is fed as an analog signal the ASIC for further processing.

The ASIC may include an analog-to-digital converter (ADC) circuit for converting the analog signal generated by the MEMS sensor into a suitable digital signal used in various systems and applications such as mobile phones, laptops, other digital mobile devices and the like. The digital signal may be generated based on pulse density modulation (PDM), which produces a highly oversampled single-bit data stream. PDM uses a constant pulse width and encodes the signal in the time between pulses. In other words, under PDM, the density of the pulses on the output of the digital MEMS microphone is proportional to the acoustic pressure level applied to the digital microphone.

The sensitivity of the digital MEMS microphone is defined as an electrical response at the output of the digital microphone in response to a given input acoustic pressure signal. In other words, the sensitivity is a ratio of the analog output voltage or digital output value to the input acoustic pressure. Depending on different applications and design needs, the sensitivity specifications of digital microphones may vary drastically. A measurement of the sensitivity under predetermined acoustic conditions is therefore desirable, especially for advanced digital MEMS microphones for which a high sensitivity is a key parameter.

SUMMARY

In accordance with an embodiment, a system comprises an analog-to-digital converter configured to convert an analog signal generated by a digital sensor into a digital signal, and a testing apparatus configured to be enabled after the analog-to-digital converter operates in a testing mode, wherein the testing apparatus comprises a filter configured to receive the digital signal from the analog-to-digital converter, and apply a filtering process to the digital signal, a control circuit configured to terminate the filtering process after an output of the control circuit reaches a predetermined reference value, and a result register configured to receive a result generated by the filter after the control circuit terminates the filtering process.

In accordance with another embodiment, a method comprises configuring an analog-to-digital converter to operate in a testing mode, configuring a filter to receive a stream of bits generated by the analog-to-digital converter, and accumulate values of the stream of bits until the number of clock cycles reaches a predetermined reference value, and transferring an output signal of the filter into a result register.

In accordance with yet another embodiment, a system comprises a delta-sigma analog-to-digital converter having inputs coupled to a digital sensor, a digital logic circuit having an input connected to the delta-sigma analog-to-digital converter, the digital logic circuit being configured to process an output signal of the delta-sigma analog-to-digital converter during a normal operation mode, and a testing circuit comprising a filter configured to receive a first stream of digital bits from an output of the delta-sigma analog-to-digital converter, and apply a filtering process to the first stream of digital bits to generate a second stream of digital bits, wherein a sample rate of the second stream of digital bits is a fraction of a sample rate of the first stream of digital bits.

In accordance with yet another embodiment, a method of operating an integrated circuit comprises operating an oversampled data converter disposed on the integrated circuit in a normal operation mode comprising receiving an input signal at an input terminal of the integrated circuit, converting the received input signal to an oversampled signal represented by an oversampled data stream, and outputting the oversampled data stream to an output terminal of the integrated circuit, and operating the oversampled data converter in a test mode comprising receiving a test signal at the input terminal of the integrated circuit, converting the received test signal to an oversampled test signal represented by the oversampled data stream, and decimating the oversampled test signal to form a decimated test signal represented by a multi-bit output, decimating comprising using a single integrator to integrate the oversampled data stream for a first predetermined number of test data stream symbols to form an integrated value, and transferring the integrated value to a result register and resetting the single integrator after the first predetermined number of test data stream symbols.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an apparatus and method for testing an analog-to-digital converter of a digital microphone. The present disclosure may also be applied, however, to a variety of systems and applications that convert an analog signal generated by any sensors into a digital signal. Hereinafter, various embodiments will be explained in detail with reference to the accompanying drawings.

Figure 1:
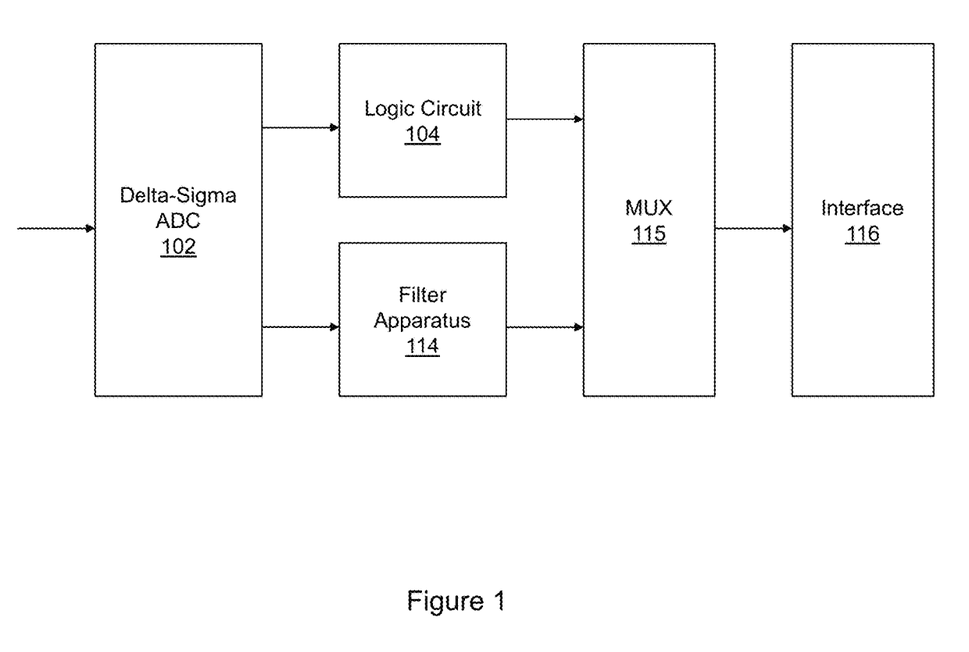
FIG. 1 illustrates a block diagram of an interface circuit in accordance with various embodiments of the present disclosure.

FIG. 1 illustrates a block diagram of an interface circuit in accordance with various embodiments of the present disclosure. The interface circuit is part of a digital sensor. In some embodiments, the digital sensor is a digital microphone. Throughout the description, the interface circuit may be alternatively referred to a digital microphone interface circuit.

As shown in FIG. 1, the digital microphone interface circuit includes a delta-sigma analog-to-digital converter (ADC) 102, a logic circuit 104, a filter apparatus 114, a multiplexer 115 and an interface unit 116. The digital microphone may include other suitable elements such as an acoustic sensor for detecting an acoustic pressure wave.

The delta-sigma ADC 102 is configured to receive an analog signal from a pressure-sensitive membrane of the digital microphone. In some embodiments, the digital microphone is implemented as a Micro-Electro-Mechanical Systems (MEMS) microphone. The delta-sigma ADC 102 is configured to operate at a predetermined first sampling frequency. Throughout the description, the sampling frequency of the delta-sigma ADC 102 may be alternatively referred to as the sample rate of the delta-sigma ADC 102.

In some embodiments, the analog input signal of the delta-sigma ADC 102 may come from a microphone sensor with a transducer, which converts a sound pressure level of an acoustic wave into an analog signal. A suitable technique such as oversampling is employed to convert the analog signal into a stream of digital bits containing information of the analog signal.

As shown in FIG. 1, the stream of digital bits may be fed into two different processing routes. A first route comprises the logic circuit 104. A second route comprises the filter apparatus 114. The output signal of the logic circuit 104 and the output signal of the filter apparatus 114 are fed into the multiplexer 115. Through the multiplexer 115, one of the output signals received is fed into the interface unit 116. The multiplexer 115 and the interface unit 116 are connected in cascade as shown in FIG. 1. In normal operation, the second route is disabled. The stream of digital bits is fed into the first route. When the delta-sigma ADC 102 is configured to operate in a testing mode, the second route is enabled. The stream of digital bits is fed into the second route comprising the filter apparatus 114.

Depending on different applications and design needs, the logic circuit 104 may vary accordingly. In some embodiments, the logic circuit 104 may comprise a low-pass filter, a digital decimation filter and an active noise control (ANC) filter. The low-pass filter is configured to attenuate high frequency components in the signal generated by the delta-sigma ADC 102. In some embodiments, the delta-sigma ADC 102 may work at a higher sampling frequency in order to meet a particular performance specification. The digital decimation filter is configured to convert the digital signal having a higher sample rate into a digital signal having a slower sample rate. The digital decimation filter may be implemented by a standard comb filter or a cascaded integrator-comb (CIC) filter as known in the art. The ANC filter may be implemented using a finite impulse response (FIR) filter. The FIR filter is well known in the art, and hence is not discussed herein.

In some embodiments, the filter apparatus 114 is implemented as a single integrator. The single integrator is configured to receive the digital signal from the output of the delta-sigma ADC 102, and apply a filtering process to the digital signal so as to reduce the sample rate of the digital signal to a suitable level. The detailed structure of the filter apparatus 114 will be described below with respect to FIGS. 2-3.

In some embodiments, the filter apparatus 114 functions as a testing apparatus for testing the delta-sigma ADC 102. The testing apparatus (e.g., filter apparatus 114) and the delta-sigma ADC 102 are disposed on a single semiconductor substrate. Alternatively, the testing apparatus and the delta-sigma ADC 102 are packed in a single semiconductor package.

In operation, the digital microphone interface circuit shown in FIG. 1 may be configured to operate either in a normal operation mode or in a testing mode. Under the normal operation mode, a first control method is applied to the digital microphone interface circuit shown in FIG. 1. In some embodiments, the first control method comprises receiving an input signal at an input terminal of the integrated circuit (e.g., input terminal of delta-sigma ADC 102), converting the received input signal to an oversampled signal represented by an oversampled data stream, and outputting the oversampled data stream to an output terminal of the integrated circuit (e.g., output terminal of logic circuit 104).

Under the testing mode, a second control method is applied to the digital microphone interface circuit shown in FIG. 1. In some embodiments, the second control method comprises receiving a test signal at the input terminal of the integrated circuit (e.g., input terminal of delta-sigma ADC 102), converting the received test signal to an oversampled test signal represented by an oversampled data stream, and decimating the oversampled test signal to form a decimated test signal represented by a multi-bit output. The step of decimating the oversampled test signal to form the decimated test signal comprises using a single integrator (e.g., integrator of filter apparatus 114) to integrate the oversampled data stream for a first predetermined number of test data stream symbols to form an integrated value, and transferring the integrated value to a result register and resetting the single integrator after the first predetermined number of test data stream symbols. The test signal comprises a signal of a first amplitude. The second control method further comprises measuring an amplitude of the decimated test signal, and determining a sensitivity of the digital microphone based on the measured amplitude of the decimated test signal.

Figure 2:
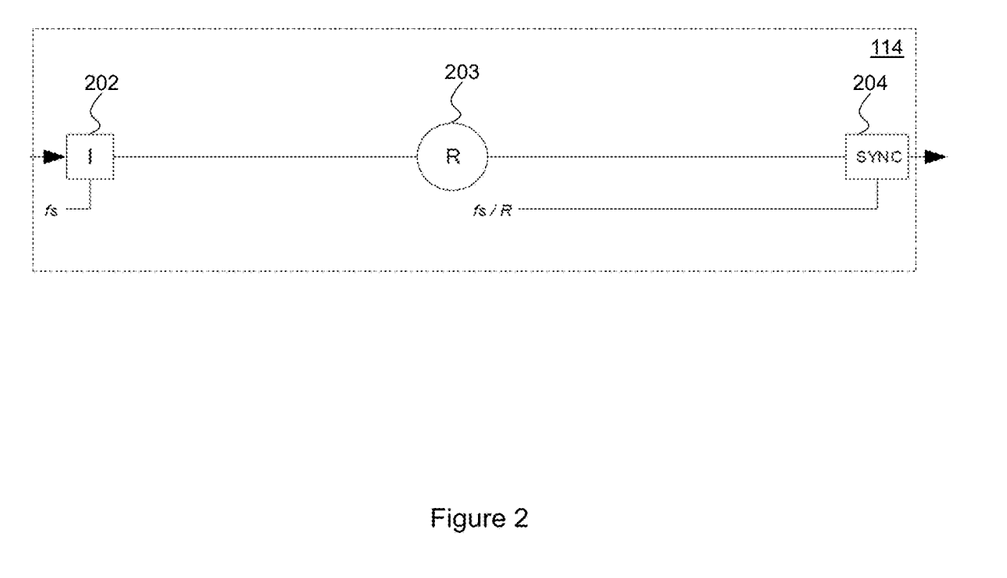
FIG. 2 illustrates a simplified block diagram of the filter apparatus shown in FIG. 1 in accordance with various embodiments of the present disclosure.

FIG. 2 illustrates a simplified block diagram of the filter apparatus shown in FIG. 1 in accordance with various embodiments of the present disclosure. The filter apparatus 114 comprises a filter 202, a sample rate converter 203 and an intermediate stage 204. In some embodiments, the filter 202 is implemented as an integrator. The intermediate stage 204 is implemented a synchronization stage. Throughout the description, the filter 202 may be alternatively referred to as an integrator. The intermediate stage 204 may be alternatively referred to as a synchronization stage.

As shown in FIG. 2, the integrator 202 is configured to receive the stream of digital bits having a first sample rate (fs). The digital bits are accumulated in the integrator 202 under the control of the sample rate converter 203. The sample rate converter 203 is controlled so that the output signal of the integrator 202 is of a second sample rate (fs/R), where R is a predetermined integer. In some embodiments, R is equal to the oversampling rate of the delta-sigma ADC 102. The output signal of the integrator 202 is transferred to a result register under the control of the synchronization stage 204.

Figure 3:
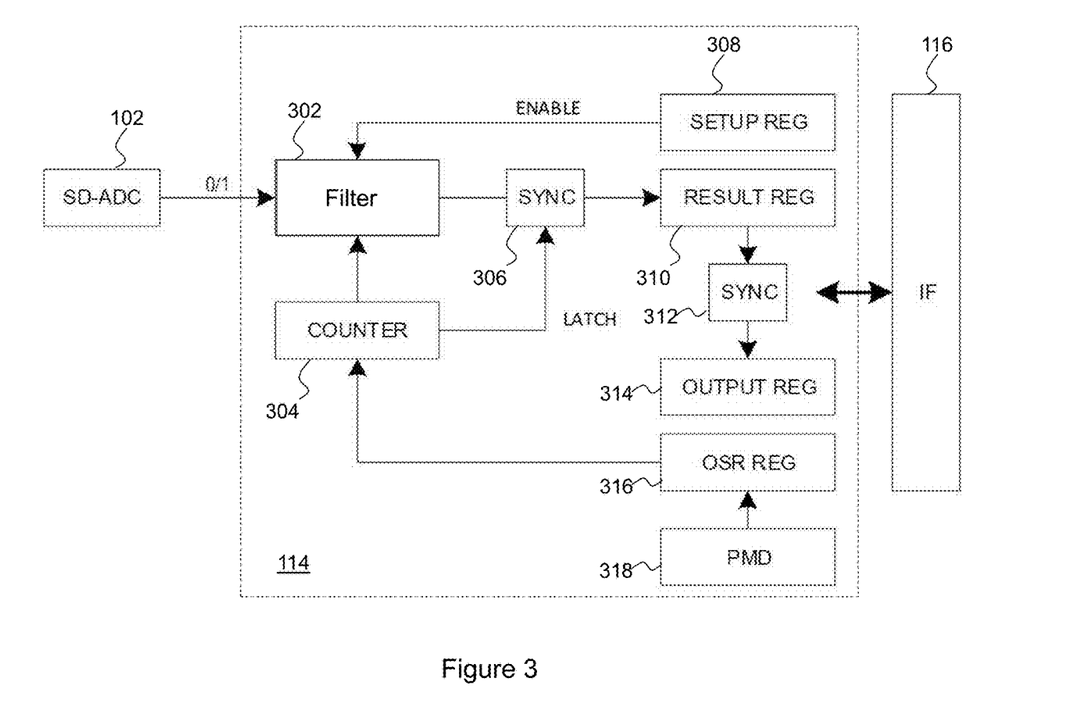
FIG. 3 illustrates a detailed block diagram of the filter apparatus shown in FIG. 1 in accordance with various embodiments of the present disclosure.

FIG. 3 illustrates a detailed block diagram of the filter apparatus shown in FIG. 1 in accordance with various embodiments of the present disclosure. As shown in FIG. 3, the filter apparatus 114 is coupled between the delta-sigma ADC 102 and the interface unit 116. The input of the filter apparatus 114 is configured to receive the output signal of the delta-sigma ADC 102. The output of the filter apparatus 114 and the input of the interface unit 116 exchange information as indicated by the double headed arrow shown in FIG. 3. It should be noted a multiplexer may be coupled between the filter apparatus 114 and the interface unit 116.

The input of the filter apparatus 114 is configured to receive a first digital signal having a first sample rate. The first digital signal is generated by the delta-sigma ADC 102. The output of the filter apparatus 114 generates a second digital signal having a second sample rate. The first sample rate is higher than the second sample rate. A ratio of the first sample rate of the delta-sigma ADC 102 to a second sample rate of the output signal of the integrator 302 is equal to the predetermined reference value. In some embodiments, the ratio of the first sample rate to the second sample rate is equal to an oversampling rate of the delta-sigma ADC 102.

As shown in FIG. 3, the filter apparatus 114 comprises a filter 302, a control circuit 304, a first synchronization stage 306, a setup register 308, a result register 310, a second synchronization stage 312, an output register 314, an oversample rate (OSR) register 316 and a power mode detector (PMD) 318. In some embodiments, the control circuit 304 is implemented as a counter. Throughout the description, the control circuit 304 may be alternatively referred to as a counter. In some embodiments, the filter 302 may be implemented as an integrator. Throughout the description, the filter 302 may be alternatively referred to as an integrator.

The bit width (NoBits) of the integrator, the counter and the registers shown in FIG. 3 is selected based on the following equation:

$$\text{NoBits} = N \times \log_2 R + N_{IN} \tag{1}$$

where R is the oversample rate of the delta-sigma ADC 102, N is the number of the integrators in the filter apparatus 114, and $N_{IN}$ is the number of bits of the pulse density modulated (PDM) data stream. In accordance with an embodiment, R is equal to 76. N is equal to 1 (one single integrator in the filter apparatus 114). $N_{IN}$ is equal to 1 (i-bit PDM date stream). The bit width of the integrator, the counter and the registers shown in FIG. 3 is equal to 7.

It should be noted that the bit width used in the previous example is selected purely for demonstration purposes and are not intended to limit the various embodiments of the present disclosure to any particular bit widths.

As shown in FIG. 3, the integrator 302 is configured to receive a digital signal from the delta-sigma ADC 102, a control signal from the counter 304 and an enable signal from the setup register 308. The setup register 308 is employed to control the operation of the integrator 302. In some embodiments, one bit of the setup register 308 is used to store the control signal for controlling the operation of the integrator 302. The setup register 308 may be accessed via suitable communication channels such as the standard communication interface of the digital microphone. In operation, when the delta-sigma ADC 102 is configured to operate in the testing mode, the setup register 308 sends the enable signal to the integrator 302. In response to this enable signal, the integrator 302 applies a filtering process to the digital signal generated by the delta-sigma ADC 102. On the other hand, when the delta-sigma ADC 102 is configured to operate in a normal operating mode, the setup register 308 disables the operation of the integrator 302.

In some embodiments, the integrator 302, the counter 304, the result register 310, the synchronization stages 306 and 312, and the output register 314 form a testing circuit configured to perform a sensitivity measurement on the digital microphone. More particularly, the testing circuit comprises a single integrator configured as a filter apparatus for converting an output signal of an analog-to-digital converter (e.g., delta-sigma ADC 102) having a first sample rate into an output signal of the testing circuit having a second sample rate. In some embodiments, the first sample rate is higher than the second sample rate.

The PMD 318 is employed to provide a reference value for the counter 304. In some embodiments, the reference value from the PMD 318 represents the actual clock rate of the delta-sigma ADC 102. The reference value from the PMD 318 is fed into the OSR register 316. The PMD 318 and the OSR register 316 are controlled such that the reference value is updated based on various operating modes. In other words, in different operating modes, the delta-sigma ADC 102 may have different oversampling rates. The reference value may be modified accordingly based on the actual oversampling rate. In some embodiments, the reference value is equal to the oversampling rate of the delta-sigma ADC 102. For example, the delta-sigma ADC 102 has an oversampling rate of 76. The reference value is equal to 76.

In testing operation, the integrator 302 and the counter 304 have been reset before proceeding with the filtering process. During the filtering process, a stream of digital bits is fed into the integrator 302. In each clock cycle, the output of the integrator 302 is increased by 1 in response to a digital bit of 1 from the stream of bits. On the other hand, the output of the integrator 302 is decreased by 1 in response to a digital bit of 0 from the stream of bits. In each clock cycle, the counter 304 is increased by 1. After the counter 304 has been increased by 1, the value of the counter 304 is compared with the reference value. If the value of the counter 304 is less than the reference value, the integrator 302 and the counter 304 proceed with the next clock cycle in which the filtering process described above is repeated. If the value of the counter 304 is equal to the reference value, the counter 304 terminates the filtering process. After the counter 304 terminates the filtering process, the integrator 302 sends the current value of the integrator 302 to the result register 310 under the control of the first synchronization stage 306.

As shown in FIG. 3, the first synchronization stage 306 is configured to communicate with the counter 304. Once the integrated process has been terminated, the first synchronization stage 306 is ready to have a data transfer between the integrator 302 and the result register 310. After sending the current value of the integrator 302 to the result register 310, both the integrator 302 and the counter 304 are reset. The integrator 302 and the counter 304 proceed with the next clock cycle. Furthermore, the value stored in the result register 310 is transferred to an output register 314 under the control of the second synchronization stage 312. The control scheme described above will be discussed again with respect to the flow chart shown in FIG. 4 below.

It should be noted that both the first synchronization stage 306 and the second synchronization stage 312 are necessary for processing the results generated by the integrator 302. When the data is processed, there may be a delay before the result is available. It is necessary to have the synchronization stages to align on the result data and latch the result data into the output register.

Figure 4:
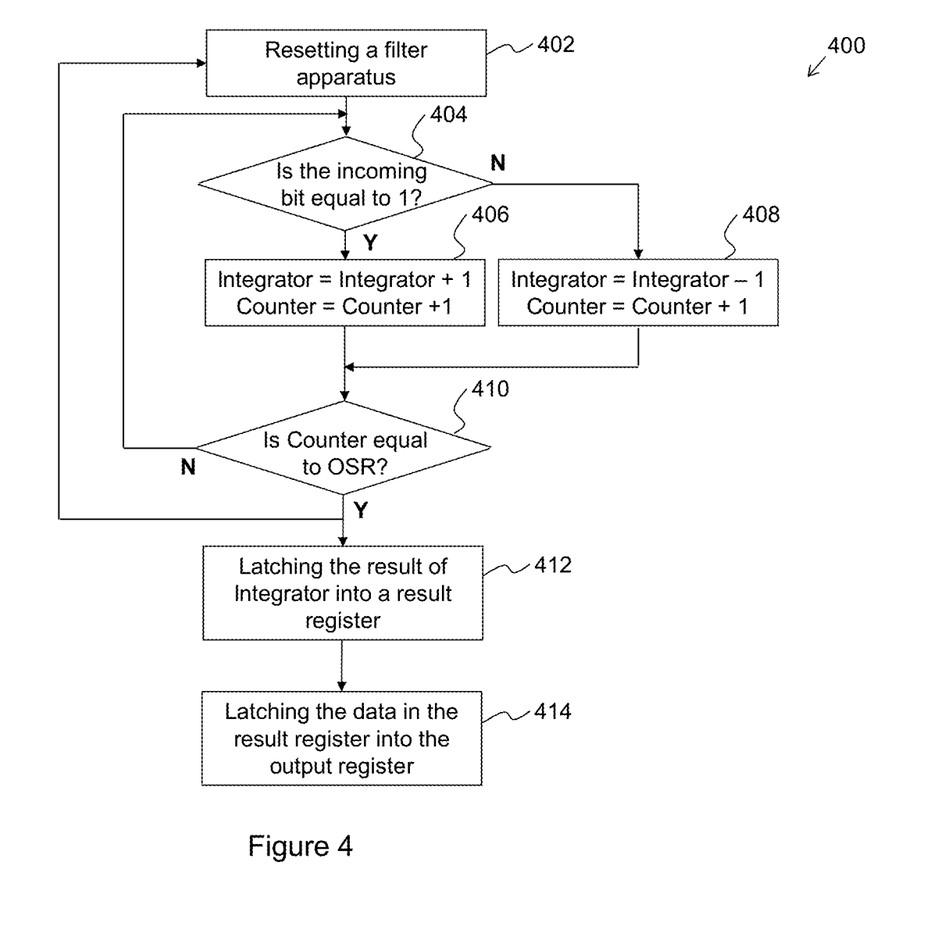
FIG. 4 illustrates a flow chart of a control method for the filter apparatus shown in FIG. 1 in accordance with various embodiments of the present disclosure.

FIG. 4 illustrates a flow chart of a control method for the filter apparatus shown in FIG. 1 in accordance with various embodiments of the present disclosure. This flowchart shown in FIG. 4 is merely an example, which should not unduly limit the scope of the claims. One of ordinary skill in the art would recognize many variations, alternatives, and modifications. For example, various steps illustrated in FIG. 4 may be added, removed, replaced, rearranged and repeated.

Referring back to FIG. 1, a delta-sigma ADC is configured to receive an analog signal generated by an acoustic sensor of a digital microphone. The delta-sigma ADC is an oversampling ADC. In operation, when the delta-sigma ADC is configured to operate in a normal mode, the delta-sigma ADC converts the analog signal into a digital signal. The digital signal is fed into a logic circuit for further processing the digital signal. On the other hand, when the delta-sigma ADC is configured to operate in a testing mode, a testing analog signal is fed into the delta-sigma ADC where the testing analog signal is converted into a testing digital signal. The testing digital signal has a first sample rate (sampling frequency). The testing digital signal is fed into a filter apparatus where the testing digital signal is converted into a digital signal having a second sample rate. The first sample rate is higher than the second sample rate.

Referring back to FIG. 2, the filter apparatus comprises a single integrator. The input signal applied to the single integrator is of a first sampling frequency. Through a sample rate converter, the input signal having the first sampling frequency is converted into an output signal having a second sampling frequency. In particular, the single integrator is employed to integrate the input signal (oversampled data stream) for a first predetermined number of test data stream symbols to form an integrated value. The integrated value is a result generated by the integrator. The result is transferred to the output of the filter apparatus through a synchronization stage.

Referring back to FIG. 3, the sample rate converter in FIG. 2 may be implemented as a counter used for converting a digital signal having a higher sampling frequency to a digital signal having a lower sampling frequency. In operation, the integrator is configured to receive a stream of bits generated by the delta-sigma ADC. In each clock cycle, the integrator receives a bit. The counter is increased by 1. The value of the counter represents the number of clock cycles. The integrator keeps accumulating values of the stream of bits until the number of clock cycles reaches a predetermined reference value. After reaching the predetermined reference value, the value of the integrator is transferred to a result register, and then both the integrator and the counter are reset. The detailed operating principles of the integrator and the counter are illustrated in the flow chart shown in FIG. 4.

In the testing mode, the control method 400 comprises providing a testing signal to the analog-to-digital converter (e.g., delta-sigma ADC shown in FIG. 1), converting the testing signal into a first digital signal having a first sample rate, decimating the first digital signal by a factor equal to the predetermined reference value using the integrator, and determining a sensitivity of the analog-to-digital converter based on a result from the step of decimating the first digital signal by the factor equal to the predetermined reference value using the integrator.

Prior to the control method 400 starting at step 402, the oversample rate of the delta-sigma ADC is retrieved and saved as a reference value. A clock signal is sent to the filter apparatus. In response to the clock signal, at step 402, the filter apparatus is reset. More particularly, the output of the integrator is set to zero. In addition, the value of the counter is set to zero.

The stream of bits generated by the delta-sigma ADC is binary bits having two levels, namely logical high and logic low. At step 404, if the incoming bit is logic high (equal to 1), the control method 400 proceeds to step 406. Otherwise, the control method 400 proceeds to step 408.

At step 406, the output signal of the integrator is increased by 1 in response to a digital bit of 1 from the stream of bits. The counter is increased by 1. After finishing step 406, the control method 400 proceeds to step 410 as shown in FIG. 4.

At step 408, the output signal of the integrator is decreased by 1 in response to a digital bit of 0 from the stream of bits. The counter is increased by 1. After finishing step 408, the control method 400 proceeds to step 410 as shown in FIG. 4.

At step 410, the value of the counter is compared with the predetermined reference value. In some embodiments, the predetermined reference value is the oversample rate (OSR) of the delta-sigma ADC. In accordance with an embodiment, OSR is equal to 76. In other words, the sampling frequency of the delta-sigma ADC is 76 times greater than the sampling frequency of the output signal of the filter apparatus. Also at step 410, if the value of the counter is equal to OSR, the control method 400 proceeds to steps 402 and 412. Otherwise, the control method 400 proceeds to step 404 where the integrator processes another incoming bit.

At step 412, the result of the integrator is latched into a result register. At step 402, the counter is reset, the counter is ready to start to count the number of clock cycles from step 404. Also at step 402, the integrator is set to zero after the result of the integrator has been latched into the result register at step 412.

At step 414, the data in the result register is latched into an output register through suitable synchronization procedures. For example, the data in the result register is latched into an output register after receiving a synchronization signal.

Figure 5:
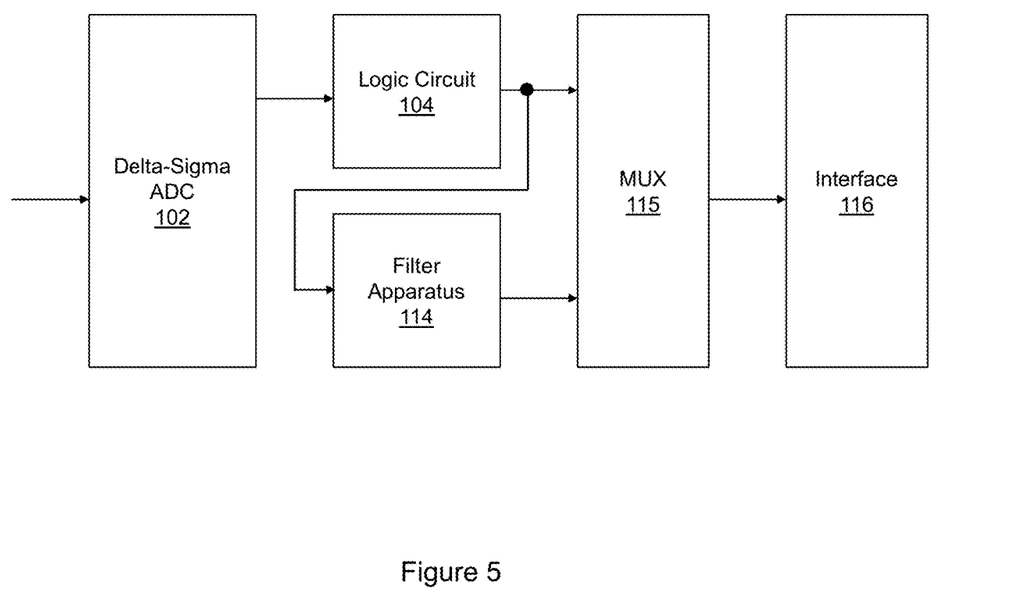
FIG. 5 illustrates a block diagram of another implementation of the interface circuit in accordance with various embodiments of the present disclosure.

FIG. 5 illustrates a block diagram of another implementation of the interface circuit in accordance with various embodiments of the present disclosure. The system configuration of the interface circuit shown in FIG. 5 is similar to that shown in FIG. 1 except that the input of the filter apparatus 114 is connected to the output of the logic circuit 104. The operating principle of the interface circuit shown in FIG. 5 is similar to that of the interface circuit shown in FIG. 1, and hence is not discussed again to avoid unnecessary repetition.

Figure 6:
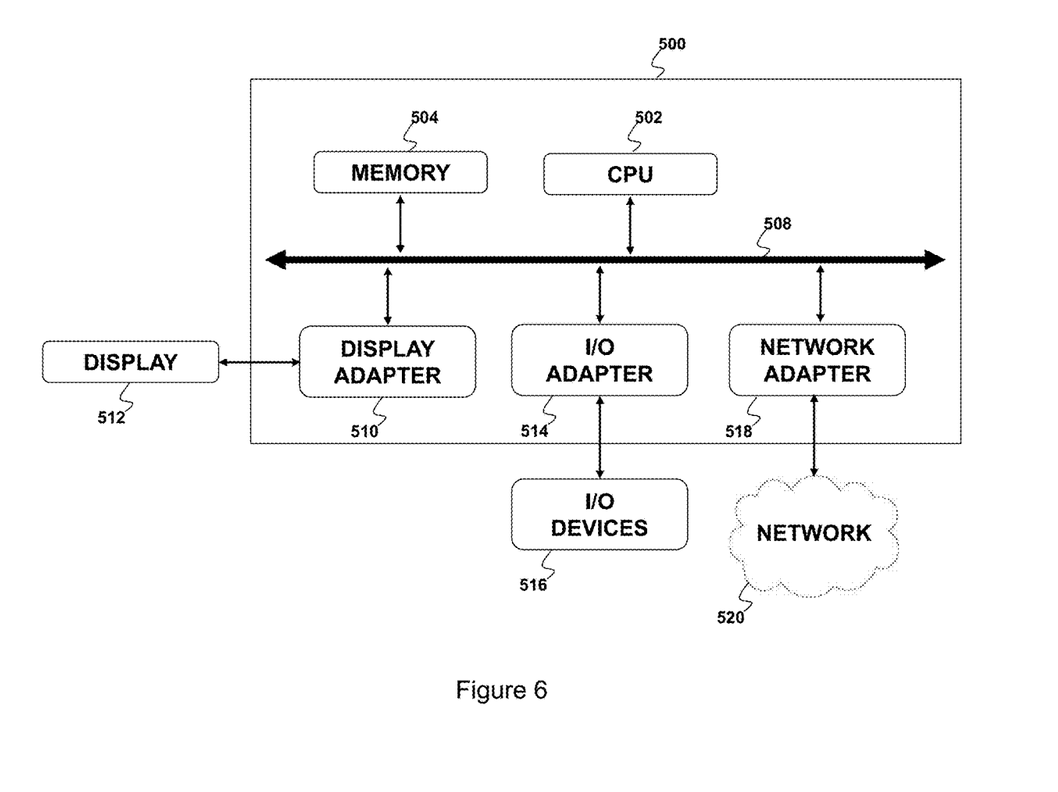
FIG. 6 illustrates a block diagram of a processing system in accordance with various embodiments of the present disclosure.

FIG. 6 illustrates a block diagram of a processing system in accordance with various embodiments of the present disclosure. The processing system 500 depicts a general-purpose platform and the general components and functionality that may be used to implement portions of the embodiment charge pump converter and/or an external computer or processing device interfaced to the embodiment charge pump converter. For example, processing system 500 may be used to control the circuit shown in FIGS. 1-3. In some embodiments, processing system 500 may be used to determine various control signals such the enable signal shown in FIG. 3.

Processing system 500 may include, for example, a central processing unit (CPU) 502, and memory 504 connected to a bus 5o8, and may be configured to perform the processes discussed above. The processing system 1100 may further include, if desired or needed, a display adapter 510 to provide connectivity to a local display 512 and an input-output (I/O) Adapter 514 to provide an input/output interface for one or more input/output devices 516, such as a mouse, a keyboard, flash drive or the like.

The processing system 500 may also include a network interface 518, which may be implemented using a network adaptor configured to be coupled to a wired link, such as a network cable, USB interface, or the like, and/or a wireless/cellular link for communications with a network 520. The network interface 518 may also comprise a suitable receiver and transmitter for wireless communications. It should be noted that the processing system 500 may include other components. For example, the processing system 500 may include hardware components power supplies, cables, a motherboard, removable storage media, cases, and the like if implemented externally. These other components, although not shown, are considered part of the processing system 500. In some embodiments, processing system 500 may be implemented on a single monolithic semiconductor integrated circuit and/or on the same monolithic semiconductor integrated circuit as other disclosed system components.

Embodiments of the present invention are summarized here. Other embodiments can also be understood from the entirety of the specification and the claims filed herein.

Example 1

A system including: an analog-to-digital converter configured to convert an analog signal generated by a digital sensor into a digital signal, and a testing apparatus configured to be enabled after the analog-to-digital converter operates in a testing mode, wherein the testing apparatus comprises a filter configured to receive the digital signal from the analog-to-digital converter, and apply a filtering process to the digital signal, a control circuit configured to terminate the filtering process after an output of the control circuit reaches a predetermined reference value, and a result register configured to receive a result generated by the filter after the control circuit terminates the filtering process.

Example 2

The system of example 1, where the analog-to-digital converter is a delta-sigma analog-to-digital converter.

Example 3

The system of one of examples 1 or 2, further including: an intermediate stage configured to control data transferring form the result register to an output register.

In some embodiments, the intermediate stage is configured to control the data transferring. More particularly, the intermediate stage is configured to send the data continuously to an output port of the analog-to-digital converter. In operation, at the beginning of the data transferring, the intermediate stage is configured to send a data package including a fixed known pattern. This fixed known pattern is used to indicate this data package is the first data package of the data transferring. After receiving the first data package, the output port continuously receives the data from the intermediate stage.

Example 4

The system of example 3, where the digital sensor is a digital silicon microphone, the filter is an integrator, the control circuit is a counter, and the intermediate stage is a synchronization stage, and wherein the integrator, the counter, the result register, the synchronization stage and the output register form a testing circuit configured to perform a sensitivity measurement on the digital silicon microphone.

Example 5

The system of example 4, where the testing circuit comprises a single integrator configured as a filter apparatus for converting an output signal of the analog-to-digital converter having a first sample rate into an output signal of the testing circuit having a second sample rate.

Example 6

The system of example 5, where a ratio of the first sample rate of the output signal of the analog-to-digital converter to the second sample rate of the output signal of the testing circuit is equal to the predetermined reference value.

Example 7

The system of one of examples 1 to 6, where the testing apparatus and the analog-to-digital converter are disposed on a single semiconductor substrate.

Example 8

The system of one of examples 1 to 7, where the predetermined reference value is determined based on an oversampling rate of the analog-to-digital converter.

Example 9

A method including: configuring an analog-to-digital converter to operate in a testing mode, configuring a filter to receive a stream of bits generated by the analog-to-digital converter, and accumulate values of the stream of bits until the number of clock cycles reaches a predetermined reference value, and transferring an output signal of the filter into a result register.

Example 10

The method of example 9, further including: increasing the output signal of the filter by 1 in response to a digital bit of 1 from the stream of bits, and decreasing the output signal of the filter by 1 in response to a digital bit of 0 from the stream of bits.

Example 11

The method of one of examples 9 or 10, further including: prior to the step of configuring the filter to receive the stream of bits generated by the analog-to-digital converter, and accumulate the values of the stream of bits, resetting the filter.

Example 12

The method of one of examples 9 to 11, further including: resetting a counter, in each clock cycle, increasing the output signal of the filter by 1 in response to a digital bit of 1 from the stream of bits, decreasing the output signal of the filter by 1 in response to a digital bit of 0 from the stream of bits, and increasing the counter by 1, and transferring the output signal of the filter into the result register after the counter reaches the predetermined reference value.

Example 13

The method of one of examples 9 to 12, further including: transferring the output signal into the result register to an output register in response to a synchronization signal.

Example 14

The method of one of examples 9 to 13, where the analog-to-digital converter is a delta-sigma analog-to-digital converter having a first sample rate, and a ratio of the first sample rate of the delta-sigma analog-to-digital converter to a second sample rate of the output signal of the filter is equal to the predetermined reference value.

Example 15

The method of one of examples 9 to 14, further including: providing a testing signal to the analog-to-digital converter, converting the testing signal into a first digital signal having a first sample rate, decimating the first digital signal by a factor equal to the predetermined reference value using the filter, and determining a sensitivity of the analog-to-digital converter based on a result from the step of decimating the first digital signal by the factor equal to the predetermined reference value using the filter.

Example 16

A system including: a delta-sigma analog-to-digital converter having inputs coupled to a digital sensor, a digital logic circuit having an input connected to the delta-sigma analog-to-digital converter, the digital logic circuit being configured to process an output signal of the delta-sigma analog-to-digital converter during a normal operation mode, and a testing circuit comprising a filter configured to receive a first stream of digital bits from an output of the delta-sigma analog-to-digital converter, and apply a filter process to the first stream of digital bits to generate a second stream of digital bits, wherein a sample rate of the second stream of digital bits is a fraction of a sample rate of the first stream of digital bits.

Example 17

The system of example 16, where the testing circuit comprises the filter configured to receive the first stream of digital bits, a control circuit configured to terminate the filtering process after an output of the control circuit reaches a predetermined reference value, a result register configured to receive a result generated by the filter after the control circuit terminates the filtering process, an output register configured to receive the result from the result register, and an intermediate stage configured to control data transferring form the result register to the output register.

Example 18

The system of example 17, where the control circuit is a counter, and wherein the counter is configured as a sample rate converter to reduce the sample rate of the first stream of digital bits.

Example 19

The system of one of examples 16 to 18, where a ratio of the sample rate of the first stream of digital bits to the sample rate of the second stream of digital bits is equal to an oversampling rate of the delta-sigma analog-to-digital converter.

Example 20

The system of one of examples 16 to 19, where the delta-sigma analog-to-digital converter, the digital logic circuit and the testing circuit are disposed on a single semiconductor substrate.

Example 21

A method of operating an integrated circuit, the method including: operating an oversampled data converter disposed on the integrated circuit in a normal operation mode comprising receiving an input signal at an input terminal of the integrated circuit, converting the received input signal to an oversampled signal represented by an oversampled data stream, and outputting the oversampled data stream to an output terminal of the integrated circuit, and operating the oversampled data converter in a test mode comprising receiving a test signal at the input terminal of the integrated circuit, converting the received test signal to an oversampled test signal represented by the oversampled data stream, and decimating the oversampled test signal to form a decimated test signal represented by a multi-bit output, decimating comprising using a single integrator to integrate the oversampled data stream for a first predetermined number of test data stream symbols to form an integrated value, and transferring the integrated value to a result register and resetting the single integrator after the first predetermined number of test data stream symbols.

Example 22

The method of example 21, where the test signal comprises a signal of a first amplitude, and the method further comprises measuring an amplitude of the decimated test signal.

Example 23

The method of one of examples 21 or 22, further comprising: determining a sensitivity based on the measured amplitude of the decimated test signal.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system comprising:
an analog-to-digital converter configured to convert an analog signal generated by a digital sensor into a digital signal; and
a testing apparatus configured to be enabled after the analog-to-digital converter operates in a testing mode, wherein the testing apparatus comprises:
a filter configured to receive the digital signal from the analog-to-digital converter, and apply a filtering process to the digital signal, wherein as a result of applying the filtering process, the digital signal having a first sample rate is converted into a result having a second sample rate lower than the first sample rate, and wherein in the filtering process, the filter keeps accumulating values of the digital signal until the number of clock cycles reaches a predetermined reference value;
a control circuit configured to terminate the filtering process after an output of the control circuit reaches the predetermined reference value; and
a result register configured to receive a result generated by the filter after the control circuit terminates the filtering process.

2. The system of claim 1, wherein:
the analog-to-digital converter is a delta-sigma analog-to-digital converter.

3. The system of claim 1, further comprising:
an intermediate stage configured to control data transferring form the result register to an output register.

4. The system of claim 3, wherein:
the digital sensor is a digital silicon microphone;
the filter is an integrator;
the control circuit is a counter; and
the intermediate stage is a synchronization stage, and wherein the integrator, the counter, the result register, the synchronization stage and the output register form a testing circuit configured to perform a sensitivity measurement on the digital silicon microphone.

5. The system of claim 4, wherein:
the testing circuit comprises a single integrator configured as a filter apparatus for converting the output signal of the analog-to-digital converter having the first sample rate into an output signal of the testing circuit having the second sample rate.

6. The system of claim 5, wherein:
a ratio of the first sample rate of the output signal of the analog-to-digital converter to the second sample rate of the output signal of the testing circuit is equal to the predetermined reference value.

7. The system of claim 1, wherein:
the testing apparatus and the analog-to-digital converter are disposed on a single semiconductor substrate.

8. The system of claim 1, wherein:
the predetermined reference value is determined based on an oversampling rate of the analog-to-digital converter.

9. A method comprising:
configuring an analog-to-digital converter to operate in a testing mode;
configuring a filter to receive a stream of bits generated by the analog-to-digital converter, and accumulate values of the stream of bits until the number of clock cycles reaches a predetermined reference value, wherein an output signal of the filter is increased by 1 in response to a digital bit of 1 from the stream of bits, and the output signal of the filter is decreased by 1 in response to a digital bit of 0 from the stream of bits; and
transferring the output signal of the filter into a result register.

10. The method of claim 9, further comprising:
prior to the step of configuring the filter to receive the stream of bits generated by the analog-to-digital converter, and accumulate the values of the stream of bits, resetting the filter.

11. The method of claim 9, further comprising:
resetting a counter;
in each clock cycle, increasing the counter by 1; and
transferring the output signal of the filter into the result register after the counter reaches the predetermined reference value.

12. The method of claim 9, further comprising:
transferring the output signal into the result register to an output register in response to a synchronization signal.

13. The method of claim 9, wherein:
the analog-to-digital converter is a delta-sigma analog-to-digital converter having a first sample rate; and
a ratio of the first sample rate of the delta-sigma analog-to-digital converter to a second sample rate of the output signal of the filter is equal to the predetermined reference value.

14. The method of claim 9, further comprising:
providing a testing signal to the analog-to-digital converter;
converting the testing signal into a first digital signal having a first sample rate;
decimating the first digital signal by a factor equal to the predetermined reference value using the filter; and
determining a sensitivity of the analog-to-digital converter based on a result from the step of decimating the first digital signal by the factor equal to the predetermined reference value using the filter.

15. A system comprising:
a delta-sigma analog-to-digital converter having inputs coupled to a digital sensor;
a digital logic circuit having an input connected to the delta-sigma analog-to-digital converter, the digital logic circuit being configured to process an output signal of the delta-sigma analog-to-digital converter during a normal operation mode; and
a testing circuit comprising a filter configured to receive a first stream of digital bits from an output of the delta-sigma analog-to-digital converter, and apply an integration process to the first stream of digital bits to generate a second stream of digital bits, wherein a sample rate of the second stream of digital bits is a fraction of a sample rate of the first stream of digital bits, and wherein in the integration process, the filter keeps accumulating values of the first stream of digital bits until the number of clock cycles reaches a predetermined reference value.

16. The system of claim 15, wherein the testing circuit comprises:
the filter configured to receive the first stream of digital bits;
a control circuit configured to terminate the integration process after an output of the control circuit reaches the predetermined reference value;
a result register configured to receive a result generated by the filter after the control circuit terminates the integration process;
an output register configured to receive the result from the result register; and
an intermediate stage configured to control data transferring form the result register to the output register.

17. The system of claim 16, wherein the control circuit is a counter, and wherein:
the counter is configured as a sample rate converter to reduce the sample rate of the first stream of digital bits.

18. The system of claim 15, wherein:
a ratio of the sample rate of the first stream of digital bits to the sample rate of the second stream of digital bits is equal to an oversampling rate of the delta-sigma analog-to-digital converter.

19. The system of claim 15, wherein:
the delta-sigma analog-to-digital converter, the digital logic circuit and the testing circuit are disposed on a single semiconductor substrate.

* * * * *